(12) United States Patent
Osame et al.

(10) Patent No.: US 7,680,239 B2
(45) Date of Patent: *Mar. 16, 2010

(54) SHIFT REGISTER AND DRIVING METHOD THEREOF

(75) Inventors: Mitsuaki Osame, Kanagawa-Ken (JP); Aya Anzai, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 821 days.

This patent is subject to a terminal disclaimer.

(21) Appl. No.: 11/457,526

(22) Filed: Jul. 14, 2006

(65) Prior Publication Data

US 2006/0245535 A1 Nov. 2, 2006

Related U.S. Application Data

(60) Continuation of application No. 11/057,172, filed on Feb. 15, 2005, now Pat. No. 7,079,617, which is a division of application No. 10/732,830, filed on Dec. 11, 2003, now Pat. No. 6,870,895.

(30) Foreign Application Priority Data

Dec. 19, 2002 (JP) .............................. 2002-368888

(51) Int. Cl.
*G11C 19/00* (2006.01)

(52) U.S. Cl. .............................. 377/64; 377/78; 377/79; 377/81

(58) Field of Classification Search ........................ None
See application file for complete search history.

(56) References Cited

U.S. PATENT DOCUMENTS 4,560,890 A * 12/1985 Masuda et al. ................. 327/65
4,633,222 A * 12/1986 Dingwall ..................... 341/122
5,262,685 A * 11/1993 Demler et al. ................. 327/91
5,453,757 A * 9/1995 Date et al. ..................... 345/89

(Continued)

FOREIGN PATENT DOCUMENTS

| EP | 1 056 069 | 11/2000 |
|---|---|---|
| EP | 1 150 274 | 10/2001 |
| JP | 01-319322 | 12/1989 |
| JP | 07-273616 | 10/1995 |
| JP | 11-184432 | 7/1999 |
| JP | 11-184440 | 7/1999 |
| JP | 2000-339984 | 12/2000 |
| JP | 2002-175040 | 6/2002 |
| JP | 2002-287711 | 10/2002 |
| TW | 480822 B | 3/2002 |

OTHER PUBLICATIONS

Office Action (EP Application No. 03 780 762.5) mailed Dec. 14, 2007 (4 pages).

(Continued)

*Primary Examiner*—Tuan Lam
(74) *Attorney, Agent, or Firm*—Fish & Richardson P.C.

(57) ABSTRACT

A low power consumption shift register which inputs a CK signal with a low voltage with almost no effect of variation in characteristics of transistors. In the invention, an input portion of an inverter is set at a threshold voltage thereof and a CK signal is inputted to the input portion of the inverter through a capacitor means. In this manner, the CK signal is amplified, which is sent to the shift register. That is, by obtaining the threshold potential of the inverter, the shift register which operates with almost no effect of variation in characteristics of transistors can be provided. A level shifter of the CK signal is generated from an output pulse of the shift register, therefore, the low power consumption shift register having the level shifter which flows a shoot-through current for a short period can be provided.

12 Claims, 11 Drawing Sheets

U.S. PATENT DOCUMENTS

| | | | |
|---|---|---|---|
| 6,275,210 | B1 | 8/2001 | Maekawa |
| 6,713,324 | B2 | 3/2004 | Shiba |
| 6,809,706 | B2 | 10/2004 | Shimoda |
| 6,909,417 | B2 * | 6/2005 | Washio et al. .................. 345/98 |
| 6,980,191 | B2 | 12/2005 | Nakamura et al. |
| 7,193,604 | B2 * | 3/2007 | Kubota et al. ............... 345/100 |
| 7,446,581 | B2 * | 11/2008 | Ishii et al. ................... 327/210 |
| 2001/0035862 | A1 | 11/2001 | Nakamura |
| 2002/0021295 | A1* | 2/2002 | Koyama et al. ............. 345/205 |
| 2002/0036625 | A1 | 3/2002 | Nakamura |
| 2002/0075211 | A1 | 6/2002 | Nakamura |
| 2003/0174115 | A1 | 9/2003 | Washio |
| 2004/0257136 | A1 | 12/2004 | Osame |

OTHER PUBLICATIONS

International Search Report (Application No. PCT/JP03/16028), Apr. 13, 2004 (in Japanese), 5 pages.

International Preliminary Examination Report (Application No. PCT/JP03/16028), Apr. 30, 2004, Partial Translation, 4 pages.

European Search Report (Application No. 03780762.5), dated Apr. 3, 2006, 3 pages.

Office Action (Taiwan Application No. 95146125) dated Dec. 22, 2009.

* cited by examiner (A)

(B)

(A)

(B)

(A)

(B)

SHIFT REGISTER AND DRIVING METHOD THEREOF

CROSS-REFERENCE TO RELATED APPLICATIONS

This application is a continuation of U.S. application Ser. No. 11/057,172, filed Feb. 15, 2005, now U.S. Pat. No. 7,079,617, which is a divisional of U.S. application Ser. No. 10/732,830, filed Dec. 11, 2003, now U.S. Pat. No. 6,870,895. The disclosures of the prior applications are considered part of (and are incorporated by reference in) the disclosure of this application for all purposes.

TECHNICAL FIELD

The present invention relates to an active matrix display device which displays an image by an input of a video signal. More particularly, the invention relates to a shift register which generates a sampling pulse which sequentially samples the video signal.

BACKGROUND ART

In recent years, an active matrix display device such as a liquid crystal display device and a light emitting device has been developed in response to the expanding demand for portable use and the like. In particular, technology for integrally forming a pixel and a driver circuit (referred to as an internal circuit, hereinafter) on an insulator by using a transistor formed by using a polycrystalline semiconductor (polysilicon) has been actively developed. An internal circuit includes a source signal line driver circuit and a gate signal line driver circuit, and controls pixels arranged in matrix.

Further, the internal circuit is connected to a controller IC and the like (referred to as an external circuit, hereinafter) through a flexible printed circuit (FPC) and the like to control its operation. An external circuit typically operates at a lower voltage than a power supply voltage of an internal circuit because an IC used for the external circuit is in single crystal form. At present, the external circuit normally operates at a power supply voltage of 3.3 V while the internal circuit operates at a power supply voltage of approximately 10 V. Thus it is necessary to amplify the CK signal to the voltage equivalent to the power supply voltage of the internal circuit with a level shifter and the like for operating a shift register of the internal circuit by a clock (referred to as CK, hereinafter) signal of the external circuit.

In the case of amplifying the CK signal by the external circuit, problems arise in that the number of components such as a level shifter IC and a power supply IC is increased, which consumes more power. In the internal circuit, by providing an input portion of an FPC with a level shifter for amplifying the CK signal to supply it to all the stages of the shift register, problems arise in that the size of layout area and the power consumption are increased and a high frequency operation becomes difficult.

In view of the aforementioned, a shift register which is operated at a CK signal of a low voltage has been proposed. By providing a data transfer portion as a differential amplifier, the shift register of the invention can be operated satisfactorily even at a low power supply voltage and a low voltage input signal (e.g. see Japanese Patent Application Laid-open No. Hei 11-184432).

The shift register provided with the data transfer portion as a differential amplifier may not operate accurately in the case where the characteristics of transistors configuring the differential amplifier are not the estimated ones. In a polysilicon TFT other than a single crystalline TFT, variation in characteristics is a considerable problem.

In view of the above problems, the invention provides a shift register which is hardly affected by variation in characteristics of transistors and operates with low power consumption.

DISCLOSURE OF THE INVENTION

According to the invention, a CK signal is amplified when inputted to an input portion of an inverter having a threshold potential, and the amplified CK signal is sent to a shift register. That is to say, a shift register which is hardly affected by variation in characteristics of transistors can be provided by having a threshold potential of an inverter.

Furthermore, a level shifter which amplifies a CK signal operates only in a short period where the amplification of a CK signal is required since the level shifter is operated by a control signal generated by using an output pulse of the shift register. Accordingly, shoot-through current flows only for a short time in the level shifter which amplifies a CK signal, which can provide a shift register of low power consumption.

Configuration of the invention will be described below.

A shift register of the invention includes a level shifter which amplifies the amplitude of a clock signal and the level shifter includes:

a capacitor means, an inverter of which input portion is connected to a first electrode of the capacitor means, a means for electrically connecting the input portion and the output portion of the inverter, a first means for inputting a reference potential to a second electrode of the capacitor means, a second means for inputting the clock signal to the second electrode of the capacitor means, a third means for fixing a potential of an output of the level shifter, and a fourth means for fixing a potential of the input portion of the inverter during a period in which the level shifter is not operated, wherein a control signal for the level shifter is generated from an output pulse of the shift register, and wherein, H-level and L-level potential of the clock signal are used as the reference potential.

A shift register of the invention includes a level shifter which amplifies the amplitude of a clock signal and the level shifter includes:

a capacitor means, a first inverter of which input portion is connected to a first electrode of the capacitor means, a second inverter of which input portion is connected to the output portion of the first inverter, a first switch which is provided between the input portion and the output portion of the first inverter, a second switch which is provided between the input portion of the first inverter and a power supply, a first means for inputting a reference potential to a second electrode of the capacitor means, and a second means for inputting the clock signal to the second electrode of the capacitor means, wherein the second inverter includes a third switch for fixing an output potential of the level shifter during a period in which an output of the first inverter is unstable, and a control signal for the level shifter is generated from an output pulse of the shift register.

A shift register of the invention includes a level shifter which amplifies the amplitude of a clock signal and the level shifter includes:

a first inverter and a second inverter which are connected in series, a first switch which is provided between the input portion and the output portion of the first inverter, a second switch which is provided between the input portion of the first inverter and a power supply, a first capacitor means and a second capacitor means both of which first electrodes are connected to the input portion of the first inverter, a third switch for inputting a H-level clock signal as a reference potential to a second electrode of the first capacitor means, and a fourth switch for inputting a L-level clock signal as a reference potential to a second electrode of the second capacitor means, a means for inputting the clock signal to second electrodes of the first capacitor means and the second capacitor means, wherein the second inverter includes a fifth switch for fixing an output potential of the level shifter during a period in which an output from the first inverter is unstable, and a control signal for the level shifter is generated from an output pulse of the shift register.

A shift register of the invention includes a level shifter which amplifies the amplitude of a clock signal and the level shifter includes:

a first inverter and a second inverter which are connected in series, a first switch which is provided between the input portion and the output portion of the first inverter, a second switch which is provided between the input portion of the first inverter and a power supply, a first capacitor means and a second capacitor means both of which first electrodes are connected to the input portion of the first inverter, a third inverter of which output portion is connected to a second electrode of the first capacitor means, a third switch which is provided between the input portion and the output portion of the third inverter, a fourth switch which is provided between the input portion of the third inverter and a power supply, a third capacitor means of which first electrode is connected to the input portion of the third inverter, a fifth switch for inputting a H-level potential of the clock signal to a second electrode of the third capacitor means, a fourth inverter of which output portion is connected to a second electrode of the second capacitor means, a sixth switch which is provided between the input portion and the output portion of the fourth inverter, a seventh switch which is provided between the input portion of the fourth inverter and a power supply, a fourth capacitor means of which first electrode is connected to the input portion of the fourth inverter, an eighth switch for inputting an L-level potential of the clock signal to a second electrode of the fourth capacitor means, and a means for inputting the clock signal to second electrodes of the third capacitor means and the fourth capacitor means, wherein the second inverter includes a ninth switch for fixing an output potential of the level shifter during a period in which an output from the first inverter is unstable, and a control signal for the level shifter is generated from an output pulse of the shift register.

Moreover, a shift register of the invention is configured by level shifters and flip-flops of which the numbers of stages are in the ratio of 1:N (N is 2 or more).

A driving method of a shift register of the invention is a driving method of a shift register including a level shifter which amplifies the amplitude of a clock signal and the level shifter includes:

a capacitor means, an inverter of which input portion is connected to a first electrode of the capacitor means, a switch which is provided between the input portion and the output portion of the inverter, a first means for inputting a reference potential to a second electrode of the capacitor means, a second means for inputting a clock to the second electrode of the capacitor means, a third means for fixing an output potential of the level shifter, and a fourth means for fixing a potential of the input portion of the inverter, wherein during a reset period, the input portion and the output portion of the inverter are set at a threshold voltage of the inverter by turning the switch ON, a first electrode of the capacitor means is set at the threshold potential and a second electrode of the capacitor means is set at a reference potential by the first means, wherein, during a clock receiving period, the clock signal is inputted to a second electrode of the capacitor means by the second means, wherein, during a period in which an output of the inverter is unstable, an output potential of the level shifter is fixed by the third means, wherein, during a period in which the level shifter does not operate, a potential of the input portion of the inverter is fixed by the fourth means, wherein a control signal for the level shifter is generated from an output pulse of the shift register, and wherein, in a driving method of the shift register of the invention, both H-level and L-level potentials of the clock signal are used as the reference potential.

BEST MODE FOR CARRYING OUT THE INVENTION

Embodiment Modes of the invention will be described below.

Embodiment Mode 1

FIG. 1A shows a first structure of a level shifter which amplifies a CK signal of the shift register of the invention.

The level shifter of Embodiment Mode 1 includes a switch 1001 for receiving a CK signal, a reference switch 1002, a switch 1003 for setting a threshold value, a capacitor means 1004, a correction inverter 1005, a switch 1006 for fixing a potential, and an output inverter 1007. The output inverter 1007 includes a first P-type TFT 1008, a second P-type TFT 1009, and an N-type TFT 1010.

The switch 1001 for receiving a CK signal is controlled to be turned ON/OFF by a signal (2) generated from an output pulse of the shift register to supply a CK signal. The reference switch 1002 is controlled to be turned ON/OFF by a signal (1) generated from an output pulse of the shift register to supply a reference voltage to a connection of the switch for receiving CK 1001 and the capacitor means 1004. The input portion and the output portion of the correction inverter 1005 are electrically connected to each other through the switch 1003 for setting a threshold value whose ON/OFF is controlled by the signal (1). The switch 1001 for receiving a CK signal, the reference switch 1002, the switch 1003 for setting a threshold value, and the switch 1006 for fixing a potential are turned ON when a control signal has a H-level potential.

During a period in which the level shifter does not operate, the input portion of the correction inverter 1005 is connected to a GND power supply through the switch 1006 for fixing a potential in order to prevent the malfunction of the correction inverter 1005 and a shoot-through current. The switch 1006 for fixing a potential is controlled to be turned ON/OFF by a signal (3) generated from an output pulse of the shift register. In the output inverter 1007, the first P-type TFT 1008 is controlled to be turned ON/OFF by a signal (4) generated from an output pulse of the shift register in order to prevent the malfunction until a CK signal starts being supplied.

OUT has a GND potential during a period in which a level shifter does not operate and has a VDD potential during a period in which a H-level CK signal is supplied. Accordingly, the input portion of the correction inverter 1005 is fixed at a GND potential during a period in which the level shifter does not operate. A switch of the first P-type TFT 1008 is provided in the output inverter 1007 so the malfunction can be prevented by controlling a VDD output period by using the first P-type TFT 1008 when the output of the correction inverter 1005 is unstable.

Figure 1:
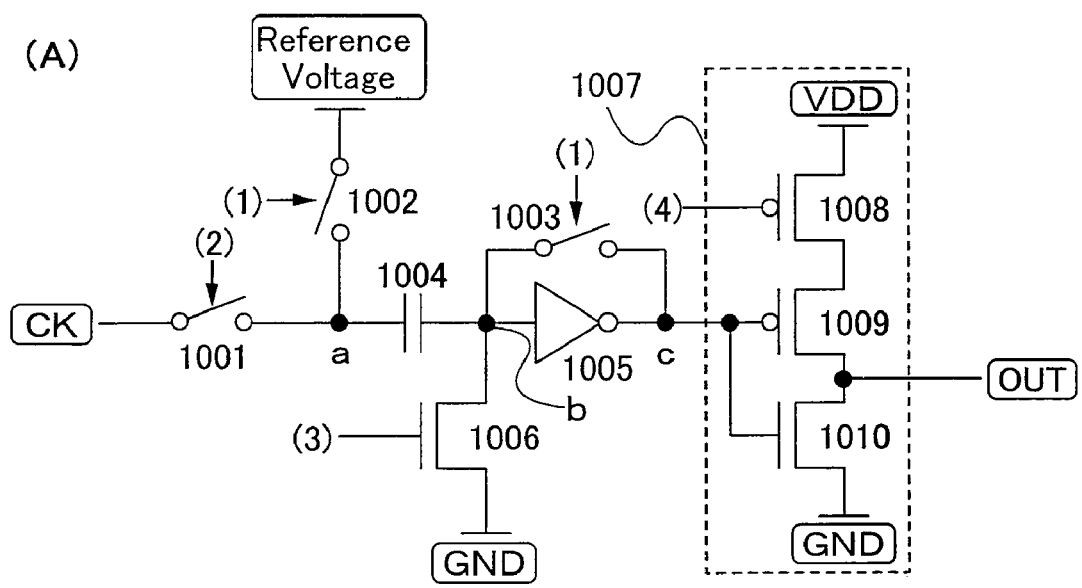
FIGS. 1A and 1B are diagrams showing Embodiment Mode 1.
Figure 1:
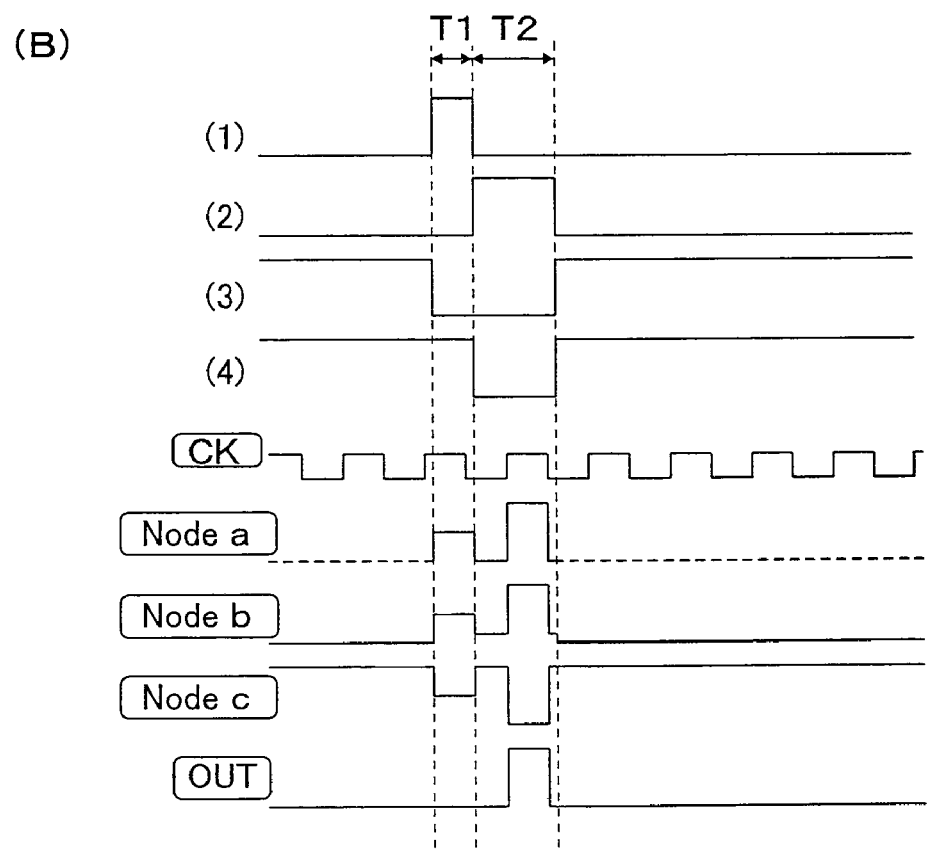
Figure 11:
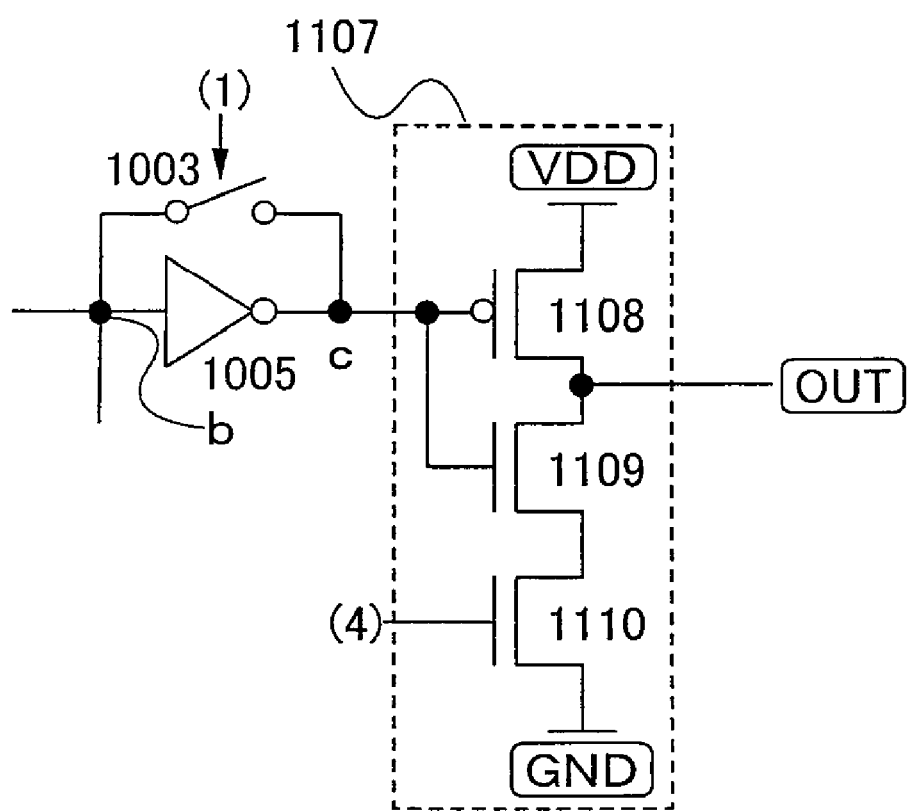
FIG. 11 is a diagram showing another structural example of an output inverter.

In the case where it is more logically convenient to fix the potential of the input portion of the correction inverter 1005 at H-level during a period in which a level shifter does not operate, a P-type TFT is used as the switch 1006 for fixing a potential to electrically connect the input portion of the correction inverter 1005 to a VDD. By applying the output inverter 1007 having a structure shown in FIG. 11, an N-type TFT 1110 controls an output period of GND instead of the first P-type TFT 1008 which controls an output period of VDD of the output inverter 1007. Accordingly, the malfunction can be prevented when the output of the correction inverter 1005 is unstable during a reset period T1. Note that same components in FIG. 11 as those in FIG. 1 are denoted by the same reference numerals.

FIG. 1B shows a timing chart of a level shifter of this embodiment mode. Described below is the operation for amplifying a CK signal of a low potential by the level shifter with reference to FIGS. 1A and 1B. We specify voltages as an example. It is set here that GND equals to 0 V, VDD equals to 7 V, H-level and L-level of the signals (1), (2), (3), and (4) equal to 7 V and 0 V, respectively, H-level and L-level of a CK signal equal to 3 V and 0 V, respectively, and the reference voltage equals to 1.5 V which is an intermediate potential of the CK signal.

First, a period T1 is a reset period. The signal (1) becomes H-level and the reference switch 1002 and the switch 1003 for setting a threshold value are turned ON. A node a has the reference potential (1.5 V). As a potential of a node b does not change since a potential of a node c is fedback to the node b, the node b has a threshold voltage of the correction inverter 1005 (3.5 V here). Here, a potential difference between each terminal of the capacitor means 1004 is stored.

Subsequently, a CK signal receiving period T2 starts. The switch 1001 for receiving a CK signal is turned ON when the signal (2) becomes H-level (7 V). At the beginning of the T2 period, a potential of the node a changes from 1.5 V to 0 V since the CK signal has an L-level (0 V) potential. As the potential difference between each terminal of the capacitor means 1004 is stored, a potential of the node b changes by the approximately same amount of a potential change of the node a. Therefore, the potential of the node b decreases from 3.5 V by approximately 1.5 V.

Figure 10:
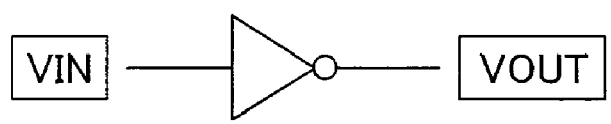
FIG. 10 is a diagram showing a characteristic of an inverter.
Figure 10:
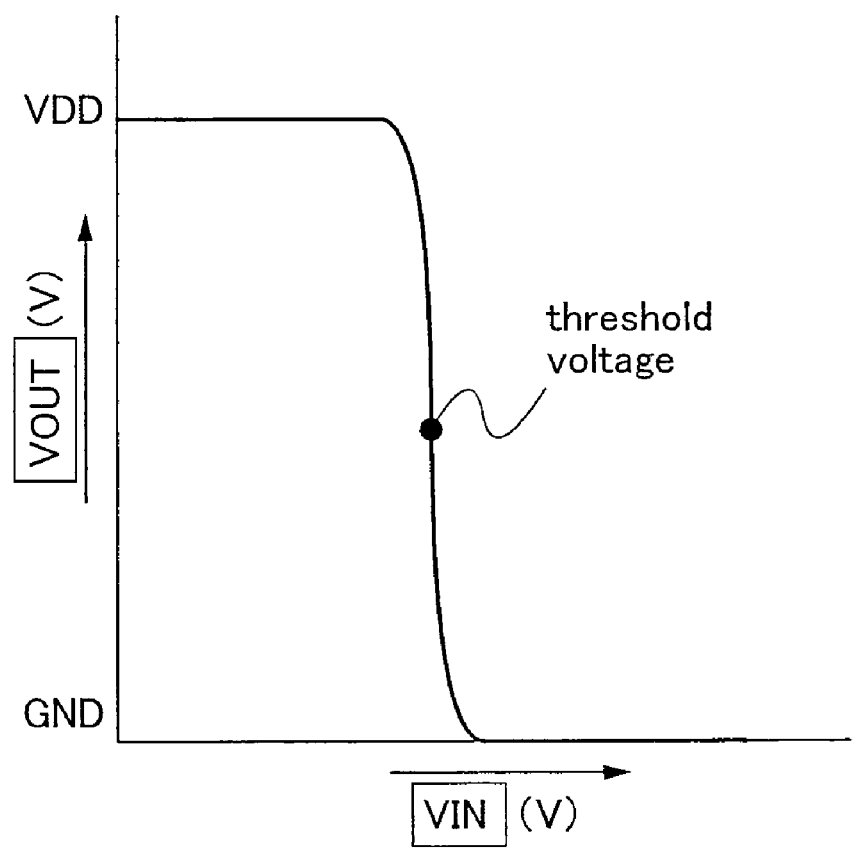

FIG. 10 shows a VIN-VOUT characteristics of a typical inverter. With even a slight change in VIN from the threshold potential, VOUT draws considerably close to VDD or GND.

Therefore, since the node b was set at a threshold potential of the correction inverter 1005 in the T1 period, the node c sensitively reacts to a potential change of the node b. In this case, a potential of the node c draws considerably close to VDD for a decreased potential of the node b. The potential of OUT remains GND (0 V).

Then in the period T2, a CK signal changes from L-level (0 V) to H-level (3 V). Accordingly, a potential of the node a increases from 0 V to 3 V and a potential of the node b increases to 3.5 V (threshold potential)+1.5 V approximately. Therefore, a potential of the node c draws close to GND. In this case, OUT has a potential of VDD (7 V) since a signal (4) is at L-level (0V).

At the end of the period T2, a CK signal changes from H-level (3 V) to L-level (0 V). Accordingly, a potential of the node a changes from 3 V to 0 V and a potential of the node b decreases to 3.5 V (threshold potential)−1.5 V approximately. Therefore, a potential of the node c draws close to VDD and OUT has a potential of GND (0 V). In this manner, a pulse which becomes H-level (7 V) in the half period of a CK signal is generated as OUT shown in FIG. 1B.

After amplifying a CK signal, a signal (3) becomes H-level (7 V) to turn ON the switch 1006 for fixing a potential and the input portion of the correction inverter 1005 is fixed at GND (0 V).

Note that, the reference potential is preferably at an intermediate potential of a CK signal amplitude, however, it is not necessarily at an exact intermediate potential. The reference potential may be equivalent to neither the highest potential nor the lowest potential of the CK signal. Additionally, the reference potential may be changed slightly within the amplitude of the CK signal. Also, this intermediate potential may be generated in an external circuit or an internal circuit.

According to this embodiment mode, even when the amplitude of CK signal is small relatively to a power supply voltage, it is possible to amplify the CK signal without being affected by the variation in characteristics of transistors. During a period in which a level shifter does not operate, a potential is fixed to prevent the malfunction and a shoot-through current. Accordingly, low power consumption is realized. In this manner, the invention is suitable for a shift register using a polysilicon TFT and the like which have large variation in characteristics of the transistors.

Embodiment Mode 2

Figure 2:
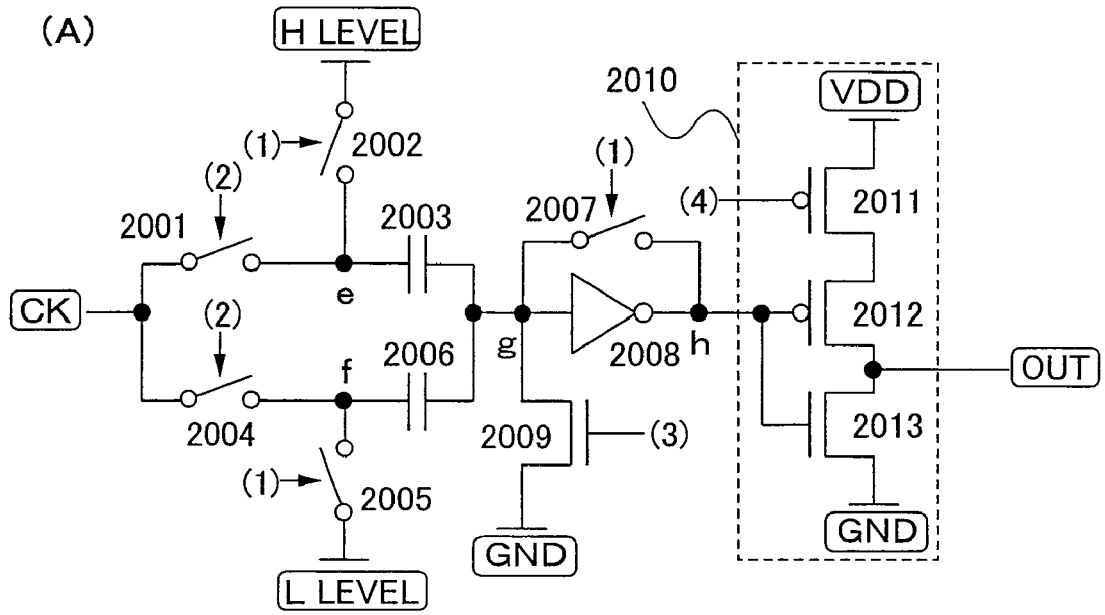
FIGS. 2A and 2B are diagrams showing Embodiment Mode 2.
Figure 2:
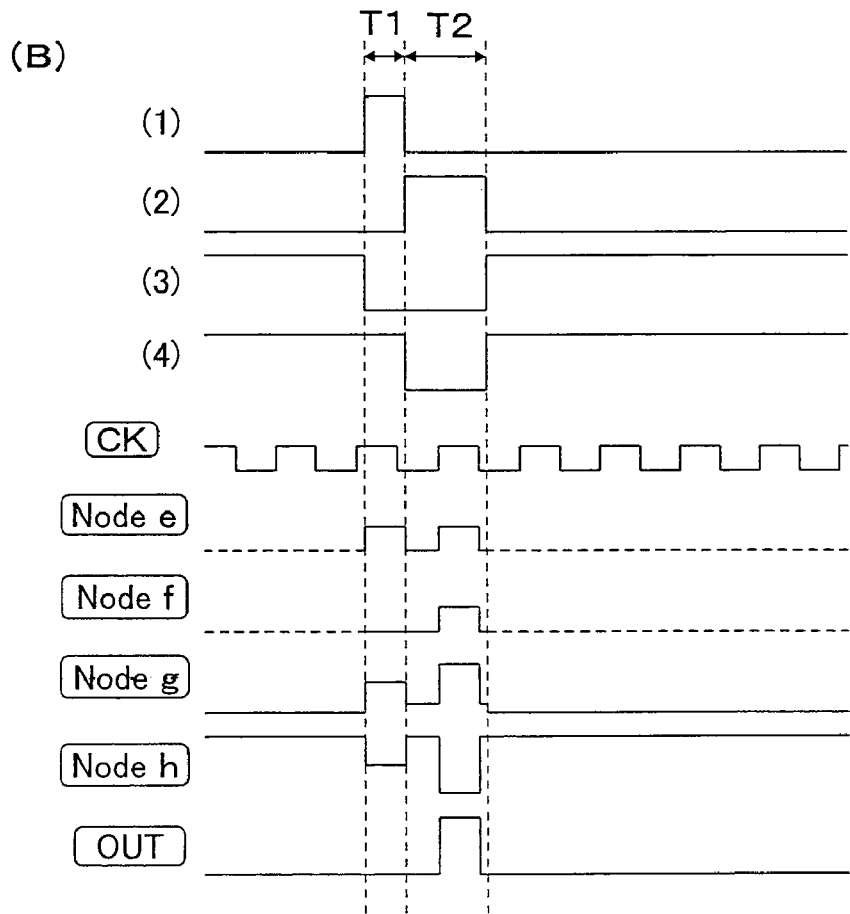

FIG. 2A shows a second structure of a level shifter which amplifies a CK signal of the shift register of the invention.

Described in Embodiment Mode 1 is the case of using the intermediate potential of a CK signal as the reference potential. In Embodiment Mode 2, a CK signal is amplified by using H-level and L-level of the CK signal as the reference potential instead of the intermediate potential.

The level shifter in this embodiment mode includes a first switch 2001 for receiving a CK signal and a second switch 2004 for receiving a CK signal, a first reference switch 2002 and a second reference switch 2005, a capacitor means 2003 for setting H-level and a capacitor means 2006 for setting L-level, a switch 2007 for setting a threshold value, a correction inverter 2008, a switch 2009 for fixing a potential, and an output inverter 2010. The output inverter 2010 includes a first P-type TFT 2011, a second P-type TFT 2012, and an N-type TFT 2013.

A capacitor means connected to the input portion of the correction inverter 2008 in the level shifter in this embodiment mode can be divided into the capacitor means 2003 for setting H-level and the capacitor means 2006 for setting L-level. The first reference switch 2002 and the first switch 2001 for receiving a CK signal are connected to a terminal of the capacitor means 2003 for setting H-level which is in the counter direction to the terminal thereof connected to the correction inverter 2008. The second reference switch 2005 and the second switch 2004 for receiving a CK signal are connected to a terminal of the capacitor means 2006 for setting L-level which is in the counter direction to the terminal thereof connected to the correction inverter 2008. It assumed that the capacitance of the capacitor means 2003 for setting H-level and the capacitor means 2006 for setting L-level are the same.

As for the switch for setting a threshold value 2007, the switch 2009 for fixing a potential, and the output inverter 2010, similarly to Embodiment Mode 1, the switch 2007 for setting a threshold value is provided between the input portion and the output portion of the correction inverter 2008 and the output inverter 2010 is connected to the output side of the correction inverter 2008. The first P-type TFT 2011 which controls an output period of VDD is provided in the output inverter 2010. By controlling the output period of VDD by using the first P-type TFT 2011, the malfunction can be prevented when the output of the correction inverter 2008 is unstable. In order to fix a potential during a period in which the level shifter does not operate, the input portion of the correction inverter 2008 is connected to GND through the switch 2009 for fixing a potential.

In the case where it is more logically convenient to fix the potential of the input portion of the correction inverter 2008 at H-level during a period in which a level shifter does not operate, a P-type TFT is used as the switch 2009 for fixing a potential to electrically connect the input portion of the correction inverter 2008 to VDD. By applying the output inverter 2010 having a structure such as the output inverter 1107 shown in FIG. 11 similarly to Embodiment Mode 1, an N-type TFT 1110 controls an output period of GND instead of the first P-type TFT 2011 which controls an output period of VDD of the output inverter 2010. Accordingly, the malfunction can be prevented when the output of the correction inverter 2008 is unstable during a reset period T1. Note that same components in FIG. 11 as those in FIG. 1 are denoted by the same reference numerals.

FIG. 2B shows a timing chart of a level shifter of this embodiment mode. Described below with reference to FIGS. 2A and 2B is the operation for amplifying a CK signal of a low potential by the level shifter of this embodiment mode. We specify voltages as an example. It is set here that GND equals to 0 V, VDD equals to 7 V, H-level and L-level of the signals (1), (2), (3), and (4) equal to 7 V and 0 V, respectively, H-level and L-level of a CK signal equal to 3 V and 0 V, respectively, and H-level and L-level of the reference voltage equals to 3 V and 0 V, respectively.

The timings of control signals (1), (2), (3), and (4) are the same as the ones in Embodiment Mode 1. First, in a reset period T1, the first reference switch 2002 and the second reference switch 2005 are turned ON and potentials of a node e and a node f become 3 V and 0 V, respectively. The input portion of the correction inverter 2008 becomes a threshold voltage thereof when the switch 2007 for setting a threshold value is turned ON. Each potential difference between each terminal of the capacitor means 2003 for setting H-level and of the capacitor means 2006 for setting L-level is stored here.

Subsequently, a CK signal receiving period T2 starts. The first switch 2001 for receiving a CK signal and the second switch 2004 for receiving a CK signal are turned ON. At the beginning, a potential of the node e changes from 3 V to 0 V and a potential of the node f remains 0 V since the CK signal has L-level (0 V). As a result of the potential change of the node e, a potential of a node g decreases from the threshold potential of the correction inverter 2008 by approximately 1.5 V. Then a CK signal becomes H-level (3 V), both potentials of the node e and the node f are increased from 0 V to 3 V. As a result of the potential change of the node f, a potential of the node g increases from the threshold potential of the correction inverter 2008 by approximately 1.5 V. At the end of the T2 period, a CK signal becomes L-level (0 V) and a potential of the node g decreases from the threshold potential of the correction inverter 2008 by approximately 1.5 V. In this manner, a pulse which becomes H-level (7 V) in the half period of a CK signal is generated as OUT shown in FIG. 2B.

As described above, it is possible to amplify a CK signal by using H-level and L-level of the CK signal as a reference potential instead of the intermediate potential. Therefore, the number of power supplies can be reduced by using a H-level power supply and an L-level power supply of a CK signal without adding a power supply of an intermediate potential of a CK signal.

Embodiment Mode 3

Figure 3:
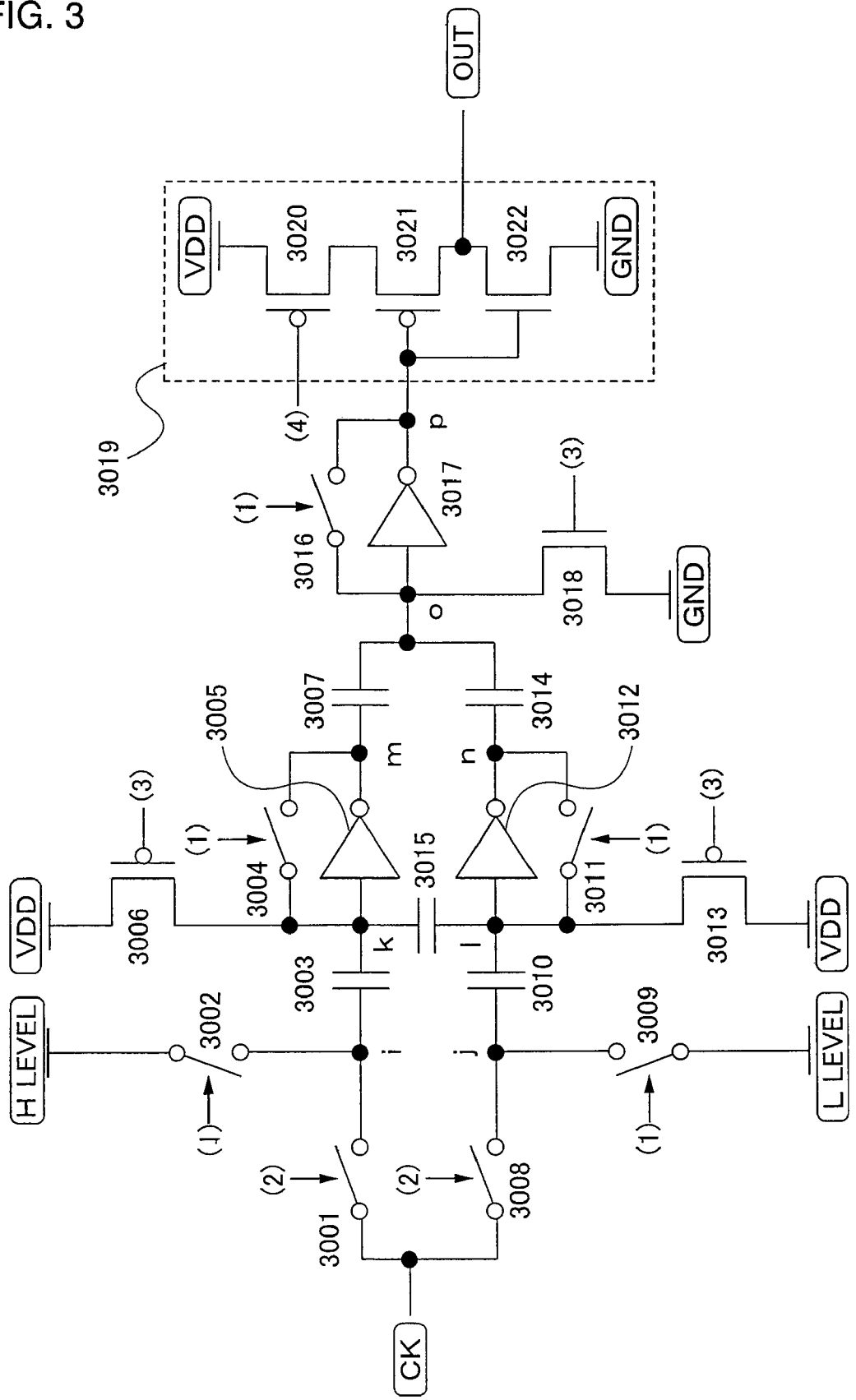
FIG. 3 is a diagram showing Embodiment Mode 3.

FIG. 3 shows a third structure of a level shifter which amplifies a CK signal of a shift register of the invention.

In Embodiment Modes 1 and 2, a potential of an input portion of a correction inverter changes from a threshold potential by approximately half of a CK signal amplitude when a CK signal is received. Described in Embodiment Mode 3 is the case of changing the potential by the equivalent to a CK signal amplitude.

The level shifter of this embodiment mode has a first switch 3001 for receiving a CK signal and a second switch 3008 for receiving a CK signal, a first reference switch 3002 and a second reference switch 3009, a first capacitor means 3003, a second capacitor means 3007, a third capacitor means 3010, a fourth capacitor means 3014 and a fifth capacitor means 3015, a first correction inverter 3005 and a second correction inverter 3012, a first switch 3004 for setting a threshold value and a second switch 3011 for setting a threshold value, a first switch 3006 for fixing a potential and a second switch 3013 for fixing a potential, a third correction inverter 3017, a third switch 3016 for setting a threshold value, a third switch 3018 for fixing a potential, and an output inverter 3019.

In the level shifter of this embodiment mode, a capacitor means connected to the input portion of the third correction inverter 3017 is divided into the second capacitor means 3007 and the fourth capacitor means 3014. The output portion of the first correction inverter 3005 is connected to a terminal of the second capacitor means 3007 which is in the counter direction to the third correction inverter 3017. The input portion of the first correction inverter 3005 is connected to the first capacitor means 3003. The input portion and the output portion of the first correction inverter 3005 are electrically connected to each other through the first switch 3004 for setting a threshold value, and the input portion of the first correction inverter 3005 is connected to VDD through the first switch 3006 for fixing a potential. The first switch 3001 for receiving a CK signal and the first reference switch 3002 are connected to a terminal of the first capacitor means 3003 which is in the counter direction to the first correction inverter 3005. A CK signal and a reference potential are sent from the first switch 3001 for receiving a CK signal and the first reference switch 3002, respectively.

The output portion of the second correction inverter 3012, is connected to a terminal of the fourth capacitor means 3014 which is in the counter direction to the third correction inverter 3017. The input portion of the second correction inverter 3012 is connected to the third capacitor means 3010. The input portion and the output portion of the second correction inverter 3012 are electrically connected to each other through the second switch 3011 for setting a threshold value, and the input portion of the second correction inverter 3012 is connected to VDD through the second switch 3013 for fixing a potential. Also, the input portion of the first correction inverter 3005 and the input portion of the second correction inverter 3012 are connected through the fifth capacitor means 3015. The second switch 3008 for receiving a CK signal and the second reference switch 3009 are connected to a terminal of the second capacitor means 3010 which is in the counter direction to the second correction inverter 3012. A CK signal and a reference potential are sent from the second switch 3008 for receiving a CK signal and the second reference switch 3009, respectively.

The input portion and the output portion of the third correction inverter 3017 are connected to each other through the third switch 3016 for setting a threshold value, and the input portion of the third correction inverter 3017 is connected to GND through the third switch 3018 for fixing a potential. The output inverter 3019 is connected to the output side of the third correction inverter 3017. The first P-type TFT 3020 which controls a VDD output period is provided in the output inverter 3019. It is here set that, capacitance of the first capacitor means, the second capacitor means, the third capacitor means, and the fourth capacitor means are equal and the capacitance of the fifth capacitor means is sufficiently smaller than those of the first capacitor means, the second capacitor means, the third capacitor means, and the fourth capacitor means.

In the case where it is more logically convenient to fix the potential of the input portion of the third correction inverter 3017 at H-level during a period in which a level shifter does not operate, a P-type TFT is used as the switch 3018 for fixing a potential to electrically connect the input portion of the third correction inverter 3017 to VDD. By applying such structure as 1107 in FIG. 11 to the output inverter 3019 similarly to Embodiment Mode 1, an N-type TFT 1110 controls a GND output period instead of the first P-type TFT 3020 which controls a VDD output period in the output inverter 3019. Accordingly, the malfunction can be prevented when the output of the third correction inverter 3017 is unstable during a reset period T1. Note that in FIGS. 11 and 1, same components are denoted by the same reference.

Figure 4:
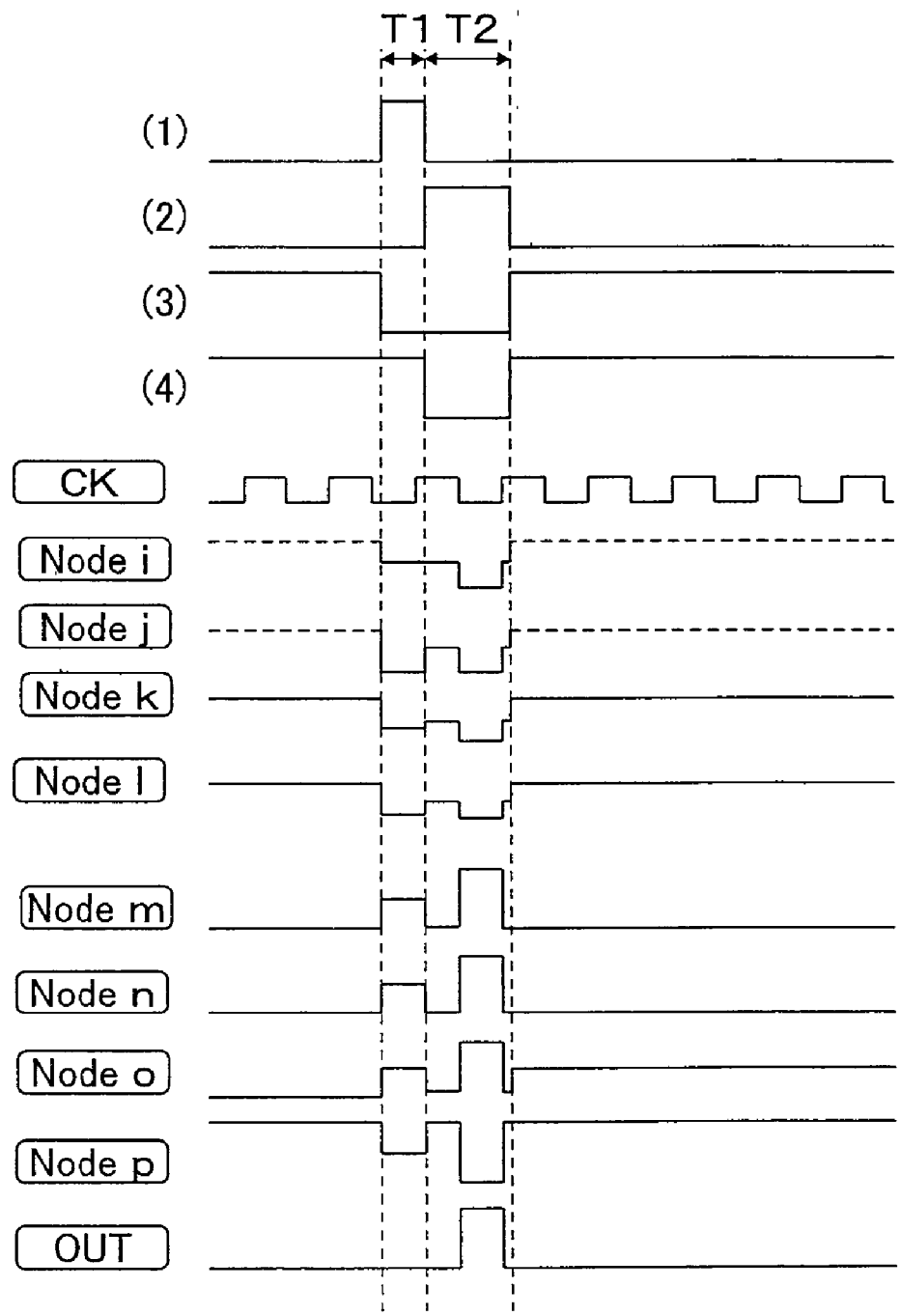
FIG. 4 is a timing chart according to Embodiment Mode 3.

FIG. 4 is a timing chart of the level shifter of this embodiment mode. Described below is the operation for amplifying a CK signal of a low potential by the level shifter of this embodiment mode with reference to FIGS. 3 and 4. We specify voltages as an example. It is set here that GND equals to 0 V, VDD equals to 7 V, H-level and L-level of the signals (1), (2), (3), and (4) equal to 7 V and 0 V, respectively, H-level and L-level of a CK signal equal to 3 V and 0 V, respectively, and H-level and L-level of a reference potential equals to 3 V and 0 V, respectively.

The timings of control signals (1), (2), (3), and (4) is the same as the one in Embodiment Modes 1 and 2. First, in a reset period T1, the first reference switch 3002 and the second reference switch 3009 are turned ON and potentials of a node i and a node j become 3 V and 0 V, respectively. Both of the input portion and the output portion of the first correction inverter 3005, the second correction inverter 3012, and the third correction inverter 3017 become a threshold voltage (3.5 V) of the first correction inverter 3005, the second correction inverter 3012, and the third correction inverter 3017, respectively with the first switch 3004 for setting a threshold value, the second switch 3011 for setting a threshold value, and the third switch 3016 for setting a threshold value turned ON. Potential differences between the each terminal of the first capacitor means, the second capacitor means, the third capacitor means, the fourth capacitor means, and the fifth capacitor means are stored here.

Subsequently, a CK signal receiving period T2 starts. The first switch 3001 for receiving a CK signal and the second switch 3008 for receiving a CK signal are turned ON. At the beginning, a potential of the node i remains 3 V and a potential of the node j changes from 0 V to 3 V since the CK signal has H-level (3 V). As a result of this potential change of the node j, a potential of a node 1 increases from 3.5 V by approximately 3 V and a node n decreases from 3.5 V to 0 V. After a potential of a node k is slightly increased by the fifth capacitor means 3015, the decrease of a potential of a node m from 3.5 V toward GND follows. Accordingly, a potential of a node o changes from 3.5 V to GND (0 V), and a node p and OUT become VDD (7 V) and GND (0 V), respectively. Then a CK signal becomes L-level (0 V) and H-level (3 V) alternately. Accordingly, each node can be changed appropriately as shown in FIG. 4.

With this structure, a potential of a correction inverter can be set to change from a threshold voltage by the equivalent to a CK signal amplitude, which provides a more stable operation. Additionally, the number of power supplies can be reduced by using H-level and L-level of a CK signal as a reference potential instead of an intermediate potential of the CK signal.

Described in Embodiment Modes 1, 2, and 3 is the case where the reference potential is inputted from a reference switch during a reset period only, however, the reference switch may be turned ON besides the reset period as well. For at least one of the electrodes of a capacitor means may have a reference potential on completion of the reset period, the reference switch may be turned ON during a period in which a level shifter does not operate and turned OFF before a CK receiving period is started.

Furthermore, in Embodiment Modes 1, 2, and 3, output of the output inverter is at L-level during a period in which the level shifter does not operate, because the shift register requires a CK signal at H-level in operating a D-flip-flop (D-FF). That is, in the case where the shift register requires a CK signal at L-level in operating the D-flip-flop (D-FF), an output of the output inverter has a H-level during a period in which the level shifter does not operate. In this case, the input portion of a correction inverter is connected to VDD through a switch for fixing a potential and a switch is provided to an N-type TFT in an output inverter in order to output a GND potential only when necessary.

For preventing the malfunction of an output inverter when the output of the correction inverter is unstable, a switch is provided to a P-type TFT or an N-type TFT of an output inverter in the aforementioned Embodiment Modes, however, the invention is not limited to this method. For example, it is also possible to prevent the output inverter from outputting a wrong level when the output of the correction inverter is unstable by providing an analog switch following an output inverter.

In addition to this, either an N-type TFT or a P-type TFT may be used as a switch for receiving a CK signal, a reference switch, a switch for setting a threshold potential, and a switch for fixing a potential in dependence on a CK signal potential and a power supply potential. Alternatively, an analog switch formed by using both an N-type and P-type TFTs may be used. Each control signal may be generated appropriately as required, such as an inverted signal in accordance with a polarity of each switch.

For fixing a potential of the input portion of the correction inverter during a period in which the level shifter does not operate, the input portion of the correction inverter is connected to a power supply through a switch for fixing a potential in the aforementioned Embodiment Modes. It is also possible to connect the output portion and the input portion of the correction inverter in a loop through a clocked inverter as long as the input portion of the correction inverter has a power supply potential. In addition, it is possible to fix a potential of a terminal of a capacitor means, which is in the counter direction to the correction inverter, to a desired potential so that the input portion of the correction inverter may have a potential which does not flow a shoot-through current.

Embodiment Mode 4

Next, a timing of generating control signals (1), (2), (3), and (4) of a level shifter from an output pulse of a shift register is described with reference to FIG. 5.

Figure 5:
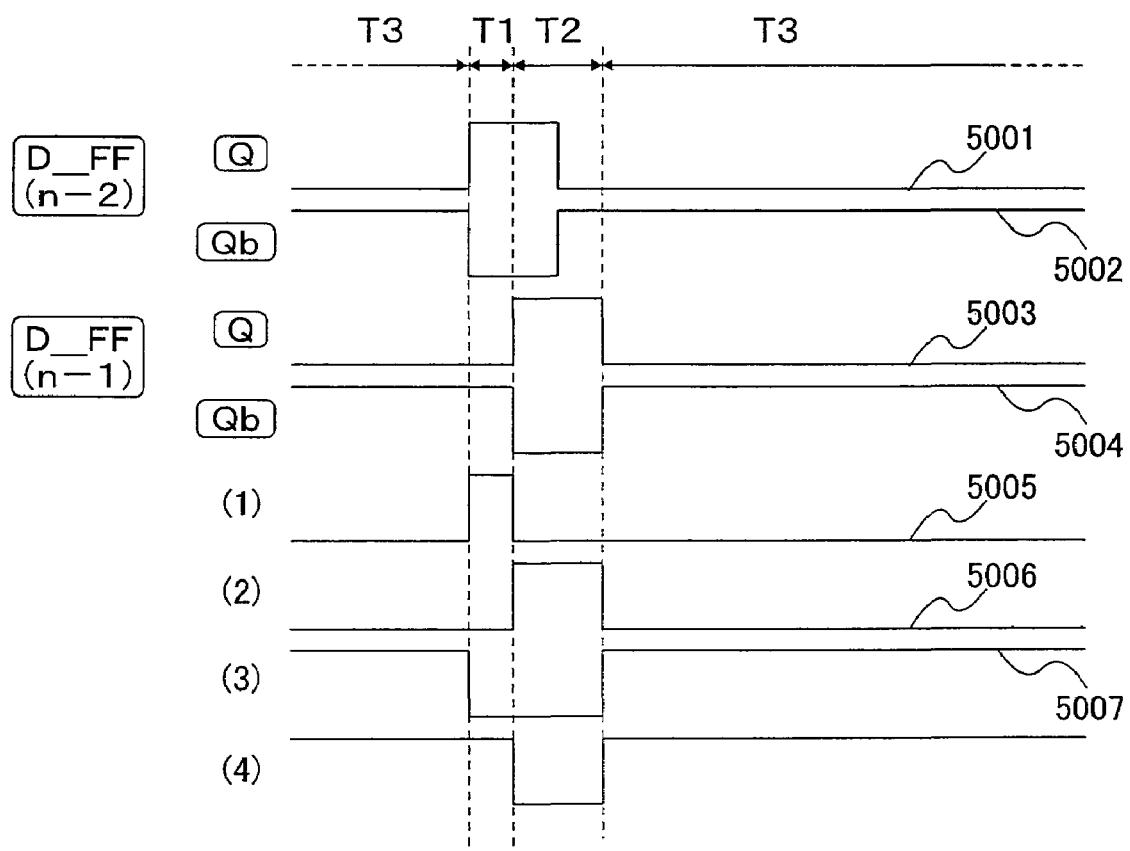
FIG. 5 is a diagram showing a timing of a control signal.

FIG. 5 is a timing chart of signals required in generating the control signals of N-th stage of level shifter attached to an N-th stage of D-flip-flop (D-FF) forming the shift register. Shown are an output Q5001 of a (N−2)th stage of D-FF, an inverted output Qb5002 of the (N−2)th stage of D-FF, an output Q5003 of a (N−1)th stage of D-FF, and an inverted output Qb5004 of the (N−1)th stage of D-FF.

In a reset period T1, the signal (1) becomes H-level. The signal (1) can be generated with NAND of the output Q5001 of the (N−2)th stage of D-FF, and the inverted output Qb5004 of the (N−1)th stage of D-FF and by inverting the NAND output. In a CK signal receiving period T2, the signal (2) becomes H-level. The signal (2) can be the output Q5003 of the (N−1)th stage of D-FF. In the potential fixing period T3, the signal (3) becomes H-level. The signal (3) can be generated with NOR of the output Q5001 of the (N−2)th stage of D-FF and the output Q5003 of the (N−1)th stage of D-FF. Further, the signal (4) for controlling VDD output of the output inverter may be an inverted signal of the signal (2).

However, the aforementioned example is the case where no signals delay, which in fact is required to be taken care of when generating the control signals. In particular, attentions are required to be paid so as to start a reset period after turning OFF the switch for fixing a potential in order to prevent a shoot-through current, to start a CK signal receiving period after the termination of the reset period in order to prevent the inputted reference potential from changing, and to turn ON (L-level) the signal (4) for controlling VDD output of the output inverter after starting the CK signal receiving period, when there are no effects of noise.

Further, each control signal of the level shifter for CK signals are generated by using the outputs of the (N−2)th stage of D-FF and the (N−1)th stage of D-FF in Embodiment Mode 4, however, the invention is not limited to this. They may be generated by using the output of a (N−3)th stage of D-FF in the reset period and using the output of (N−1)th stage of D-FF in the CK signal receiving period. In short, they may be generated appropriately from the output pulse of the shift register in dependence on the intention.

In this manner, control signals of the level shifter can be generated from the output pulse of the shift register.

Embodiment

Hereinafter described are embodiments of the invention.

Connection between the D-FF and level shifter of each stage when forming the shift register by using the level shifter described in Embodiment Modes 1, 2, and 3 is described.

Embodiment 1

Figure 6:
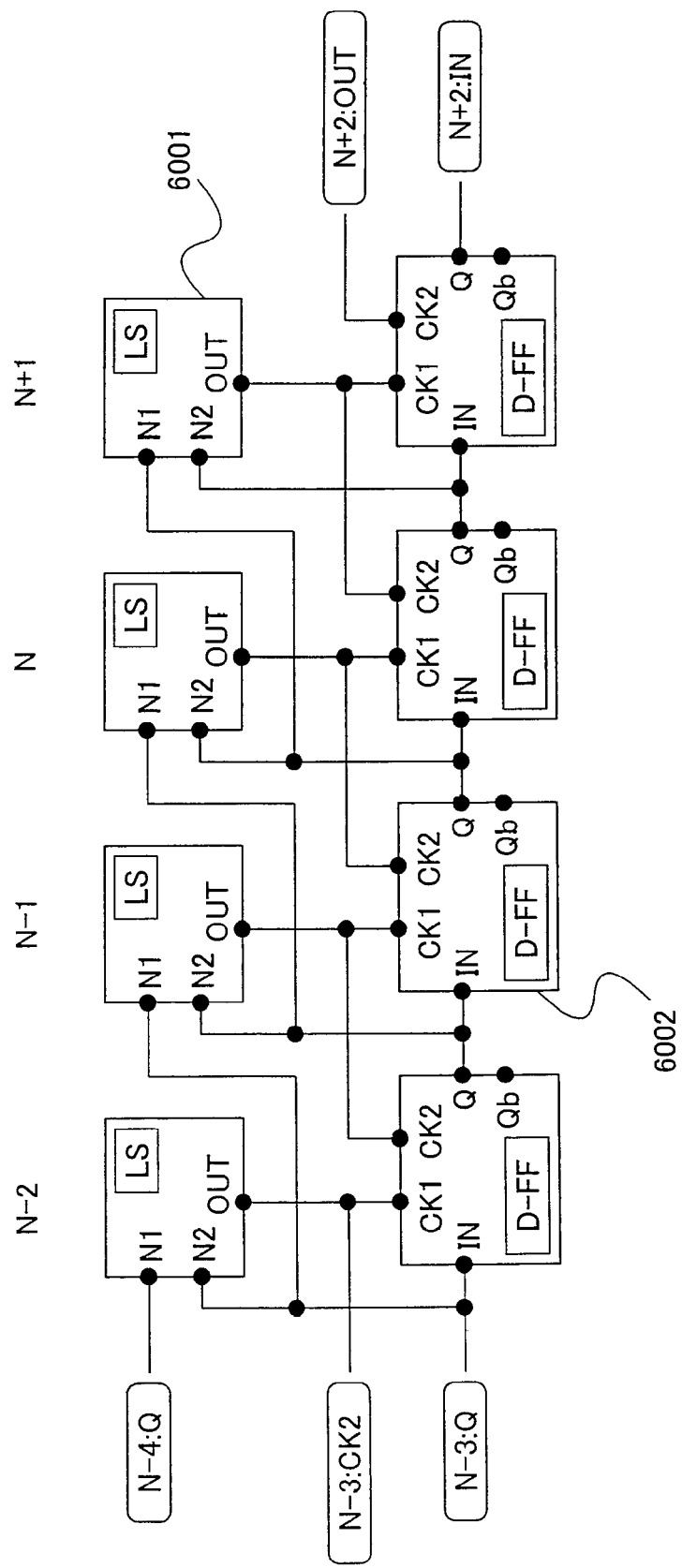
FIG. 6 is a diagram showing a structure of a shift register to which the present invention can be applied.

FIG. 6 shows a configuration example of the shift register including the level shifter of the invention.

The shift register includes a plurality of stages of level shifters (LS) 6001 and D-FF 6002. An input N1 of an N-th stage of level shifter is connected to an output Q of an (N−2)th stage of D-FF, an input N2 of the N-th stage of level shifter is connected to an output Q of an (N−1)th stage of D-FF, and an output OUT of the N-th stage of level shifter is connected to CK2 of the (N−1)th stage of D-FF and CK1 of the N-th stage of D-FF. An input IN of the N-th stage of D-FF is connected to the output Q of the (N−1)th stage of D-FF and an output Q of the N-th stage of D-FF is connected to an input IN of an (N+1)th stage of D-FF. Further, CK2 of the N-th stage of D-FF is connected to an output OUT of an (N+1)th stage of level shifter.

In this embodiment, the number of the stages of level shifters and the number of the stages of flip-flops that configure the shift register are identical, however, they may be provided by the ratio of 1:N (N is two or more). The ratio may be determined appropriately in consideration with the layout area of the circuit, operation frequency, power consumption and the like.

Embodiment 2

Figure 7:
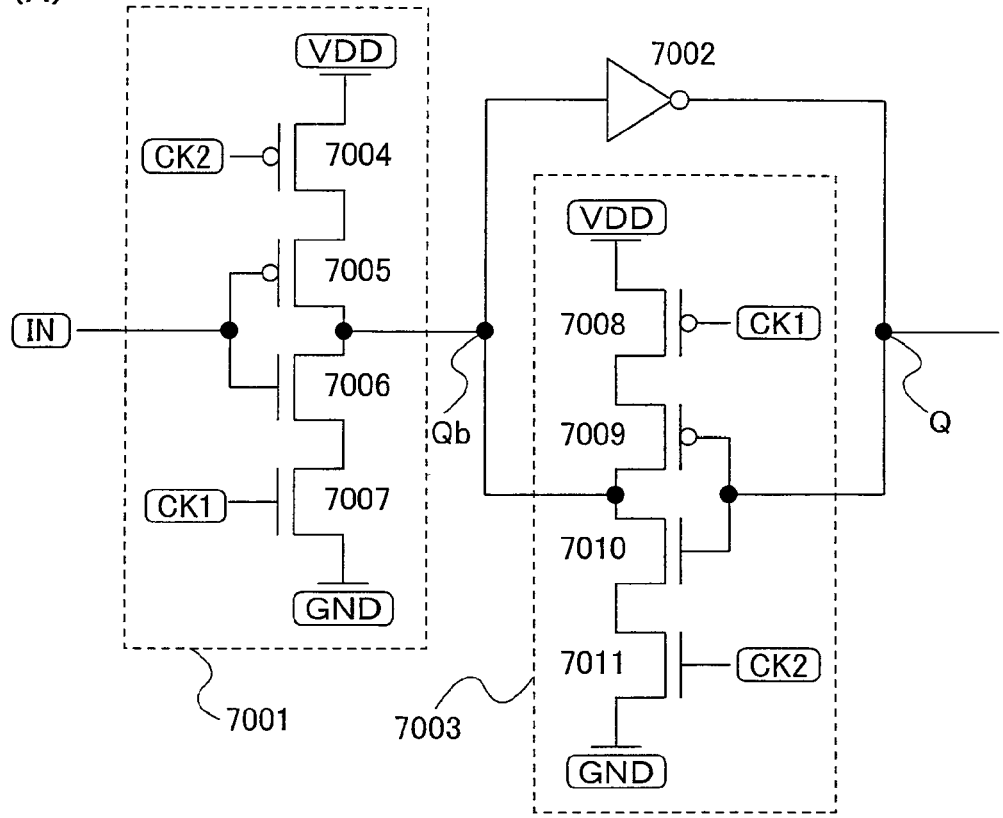
FIGS. 7A and 7B are diagrams showing a structural example of D-FF.
Figure 7:
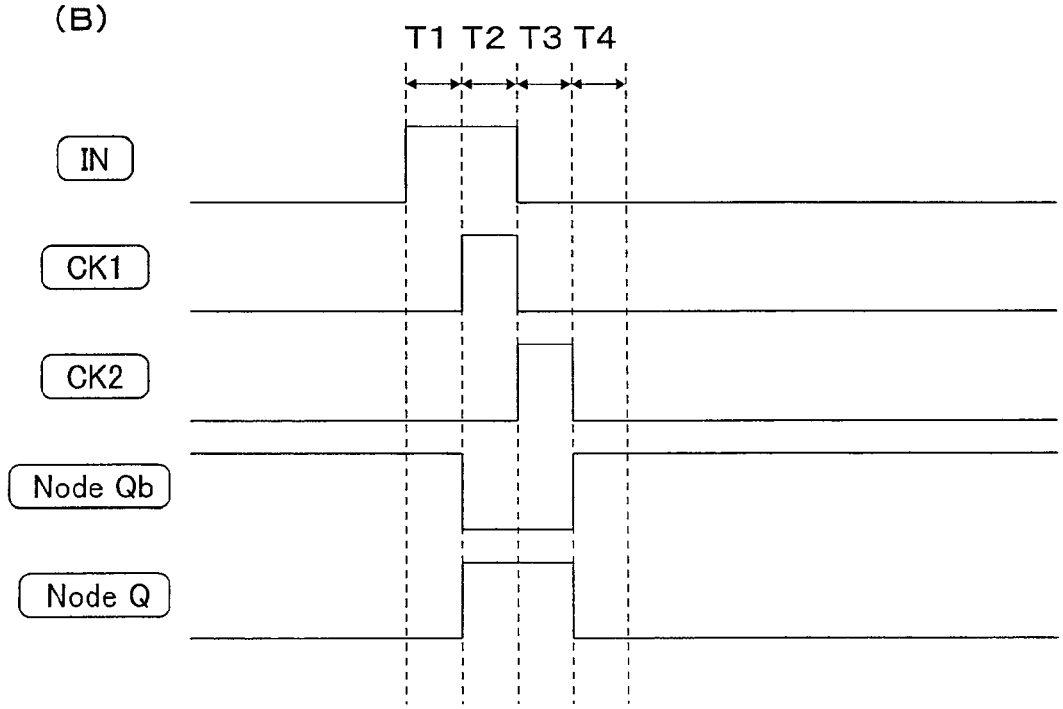

FIG. 7A shows a configuration example of the D-FF 6002 and FIG. 7B is a timing chart thereof.

The D-FF 6002 includes a first clocked inverter 7001 and an inverter 7002 connected in series, and a second clocked inverter 7003 connected to the inverter in a loop. The first clocked inverter 7001 includes a first P-type TFT 7004, a second P-type TFT 7005, a first N-type TFT 7006, and a second N-type TFT 7007 connected in series. The second clocked inverter 7003 includes a third P-type TFT 7008, a fourth P-type TFT 7009, a third N-type TFT 7010, and a fourth N-type TFT 7011 connected in series.

The second N-type TFT 7007 and the third P-type TFT 7008 are controlled to be turned ON and OFF by CK1 while the first P-type TFT 7004 and the fourth N-type TFT 7011 are controlled to be turned ON and OFF by CK2. An output (IN) of the preceding stage of D-FF is inputted to the gates of the second P-type TFT 7005 and the first N-type TFT 7006.

The operation of this embodiment is described with reference to the timing chart of FIG. 7B. First, a pulse is inputted to IN to be H-level and a second P-type TFT 7005 is turned OFF and the first N-type TFT 7006 is turned ON in a period T1. Subsequently, CK1 becomes H-level, the second N-type TFT 7007 is turned ON. A node Qb becomes a GND potential, and a node Q becomes a VDD potential in a period T2. In a period T3, CK2 becomes H-level, the fourth N-type TFT 7011 is turned ON, and the node Qb remains to have the GND potential. In a period T4, CK2 becomes L-level, the first P-type TFT 7004 is turned ON, the fourth N-type TFT 7011 is turned OFF, the node Qb becomes a VDD potential, and the node Q becomes the GND potential.

The D-FF shown in FIG. 7A is used in this embodiment, however, it is needless to say that the invention is not limited to the flip-flop of this configuration.

Embodiment 3

The timing to generate control signals of the level shifter from the output pulse of the shift register is described in Embodiment Mode 4, however, it is required in fact that those signals be inputted in consideration with the delay. The specific example is described below.

Figure 8:
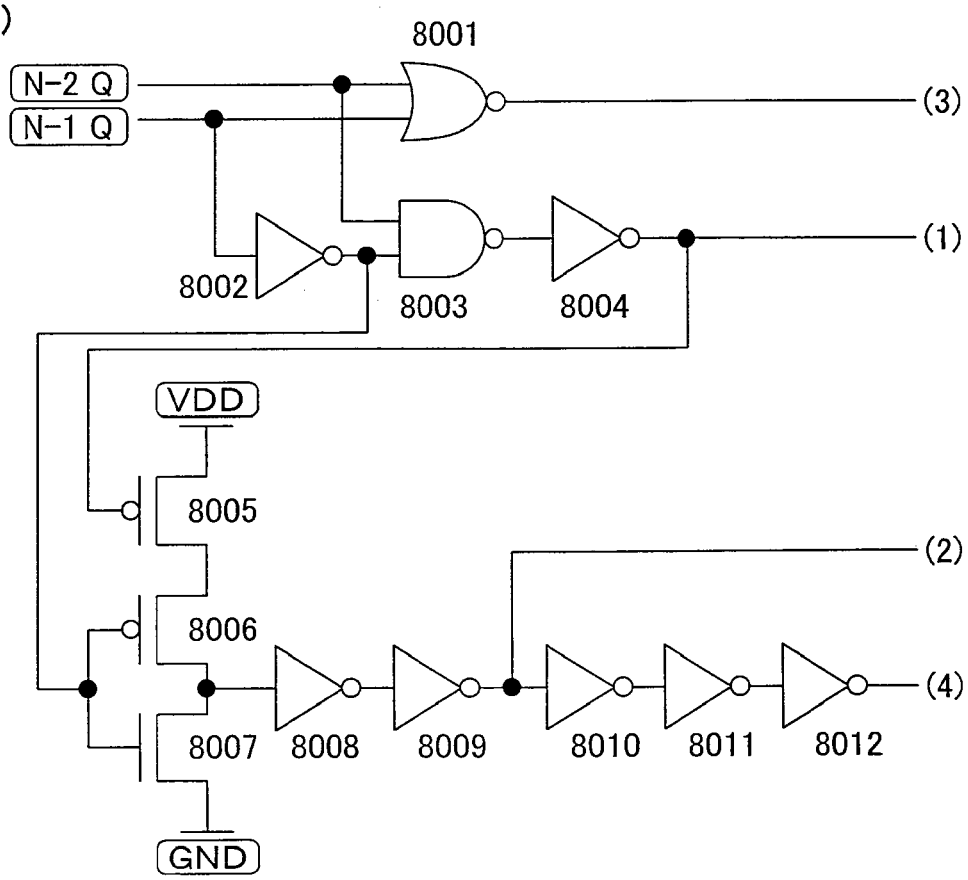
FIGS. 8A and 8B are diagrams showing an example of methods for generating a control signal according to the present invention.
Figure 8:
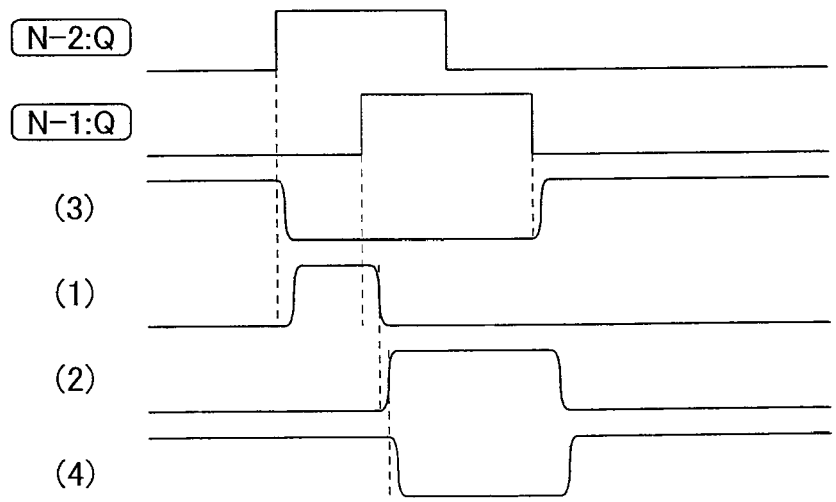

FIG. 8A is a circuit example which generates control signals (1), (2), (3), and (4) of the level shifter from the output pulse of the shift register in consideration with the delay. FIG. 8B shows a timing chart thereof.

The process of generating control signals of an N-th stage of level shifter is described. First, an output Q (N−2 Q) of an (N−2)th stage of D-FF and an output Q (N−1 Q) of an (N−1)th stage of D-FF are inputted to an NOR 8001, and an output of the NOR 8001 becomes the signal (3). When the output Q (N−2 Q) of the (N−2)th stage of D-FF has H-level, the signal (3) has L-level. Subsequently, the output Q (N−2 Q) of the (N−2)th stage of D-FF and the output Q (N−1 Q) of the (N−1)th stage of D-FF are inverted by a first inverter 8002 and they are inputted to an NAND 8003. Then, an output of the NAND 8003 is inverted by a second inverter 8004 to generate the signal (1). The signal (1) becomes H-level after the signal (3) becomes L-level since the signal (1) has more delay caused by the second inverter 8004 than the signal (3). Furthermore, by disposing a plurality of inverters in series to the second inverter 8004 additionally so that the H-levels of the signal (3) and the signal (1) do not overlap, a shoot-through current can be prevented.

A first P-type TFT 8005, a second P-type TFT 8006, and an N-type TFT 8007 are connected in series. An inverted pulse of the output Q of the (N−1)th stage of D-FF is inputted to the gate electrodes of the second P-type TFT 8006 and the N-type TFT 8007 and the signal (1) is inputted to the gate electrode of the first P-type TFT 8005. The source electrodes of the first P-type TFT 8005 and the N-type TFT 8007 are connected to VDD and GND, respectively. The drain electrodes of the second P-type TFT 8006 and the N-type TFT 8007 are connected to each other. A third inverter 8008, a fourth inverter 8009, a fifth inverter 8010, a sixth inverter 8011, and a seventh inverter 8012 are connected in series.

An input portion of the third inverter 8008 becomes H-level after the signal (1) becomes L-level since the signal (1) is inputted to the gate electrode of the first P-type TFT 8005. Further, the signal (2) is generated by inverting the signal by the fourth inverter 8009. Thus, a reset period and a CK signal receiving period is not overlapped with each other.

The signal (4) is generated with the signal (2) through the fifth inverter 8010, the sixth inverter 8011, and the seventh inverter 8012. Thus, an output inverter can output VDD after starting the CK signal receiving period.

Described in this embodiment is the configuration shown in FIG. 8A, however, it is needless to say that the invention is not limited to this. The delay, frequency and the like of each control signal are considered in the configuration.

Embodiment 4

The display device of the invention can be applied to display portions of various electronic apparatuses. In particular, the invention is suitable for a mobile device which is required to consume less power.

Specifically, the aforementioned electronic apparatuses include a portable information terminal (portable phone, mobile computer, portable game machine, electronic book and the like), a video camera, a digital camera, a goggle type display, a display, device, a navigation system and the like. Specific examples of these electronic apparatuses are shown in FIGS. 9A to 9D.

Figure 9:
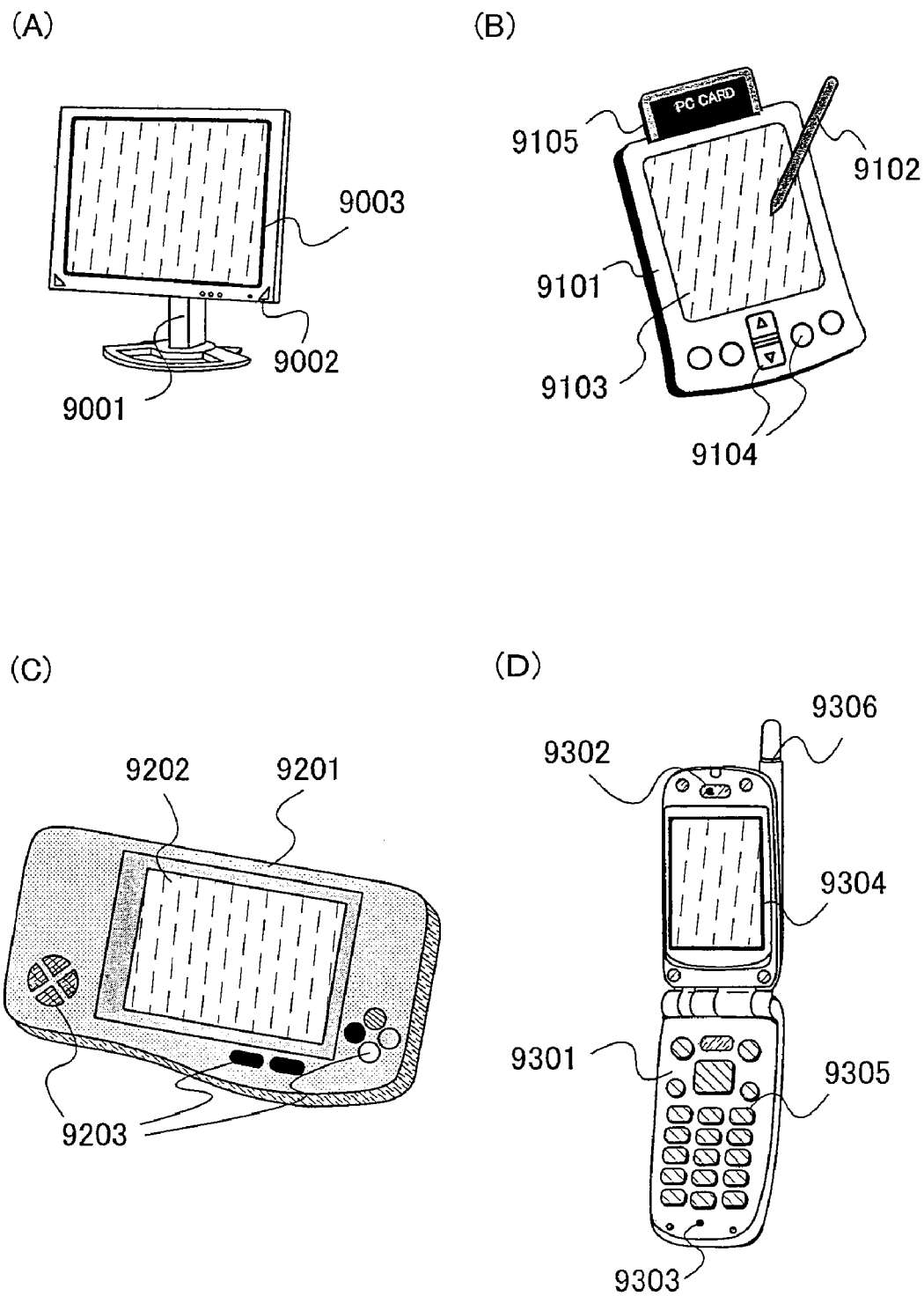
FIGS. 9A to 9D are views showing examples of electronic devices to which the present invention can be applied.

FIG. 9A illustrates a display device including a housing 9001, an audio output portion 9002, a display portion 9003 and the like. The display device of the invention can be applied to the display portion 9003. The display device includes a display for displaying all the pieces of information for personal computers, TV broadcast reception, displaying advertisement and so on.

FIG. 9B illustrates a mobile computer including a body 9001, a stylus 9102, a display portion 9103, an operating button 9104, an external interface 9105 and the like. The display device of the invention can be applied to the display portion 9103.

FIG. 9C illustrates a game machine including a body 9201, a display portion 9202, an operating button 9203 and the like. The display device of the invention can be applied to the display portion 9202.

FIG. 9D illustrates a portable phone including a body 9301, an audio output portion 9302, an audio input portion 9303, a display portion 9304, an operating switch 9305, an antenna 9306 and the like. The display device of the invention can be applied to the display portion 9304.

As described above, the application range of the display device of the invention is quite wide, and the invention can be applied to electronic apparatuses of all kinds of fields.

INDUSTRIAL APPLICABILITY

The invention is quite efficient in the case of operating a shift register with a CK signal having smaller amplitude than the power supply voltage, by using transistors having a variation in characteristics such as polysilicon TFTs. By using the shift register of the invention, the effect of the variation in characteristics can be insignificant. The level shifter of a CK signal is controlled by using a pulse generated by the shift register and operated only for a short period which is required to amplify the CK signal, therefore, the low power consumption shift register having the level shifter which flows a shoot-through current for a short period can be provided.

The invention claimed is:

1. An electronic apparatus having a display device, the display device comprising:
   a shift register having a level shifter which amplifies an amplitude of a clock signal, the level shifter comprising:
   a capacitor comprising a first electrode and a second electrode;
   a first inverter including an input portion connected to the first electrode of the capacitor;
   a second inverter including an input portion connected to an output portion of the first inverter electrically;
   a first switch for inputting a reference potential to the second electrode of the capacitor;
   a second switch for inputting the clock signal to the second electrode of the capacitor; and
   a third switch for controlling a connection between the input portion and the output portion of the first inverter by using an output pulse of the shift register.

2. An electronic apparatus according to claim 1, wherein an H-level and an L-level of the clock signal are used as the reference potential.

3. An electronic apparatus according to claim 1, further comprising a fourth switch for fixing a potential of the input portion of the first inverter.

4. An electronic apparatus according to claim 1, further comprising a fourth switch, wherein the input portion of the first inverter is connected to a GND power supply through the fourth switch.

5. An electronic apparatus having a display device, the display device comprising:
   a shift register having a level shifter which amplifies an amplitude of a clock signal, the level shifter comprising:
   a capacitor comprising a first electrode and a second electrode;
   a first inverter of which an input portion is connected to the first electrode of the capacitor;
   a second inverter of which an input portion is connected to an output portion of the first inverter electrically;
   a first switch connected to the second electrode of the capacitor;
   a second switch connected to a connection of the first switch and the second electrode of the capacitor; and
   a third switch connected to the input portion of the first inverter and the output portion of the first inverter,
   wherein the second switch inputs the clock signal to the second electrode of the capacitor,
   wherein the first switch inputs a reference potential to the second electrode of the capacitor, and
   wherein the first switch is controlled by a signal generated from an output pulse of the shift register to supply the reference voltage to the connection of the second switch and the second electrode of the capacitor.

6. An electronic apparatus according to claim 5, wherein an H-level and an L-level of the clock signal are used as the reference potential.

7. An electronic apparatus according to claim 5, further comprising a fourth switch for fixing a potential of the input portion of the first inverter.

8. An electronic apparatus according to claim 5, further comprising a fourth switch, wherein the input portion of the first inverter is connected to a GND power supply through the fourth switch.

9. An electronic apparatus having a display device, the display device comprising:
   a shift register having a level shifter which amplifies an amplitude of a clock signal, the level shifter comprising:
   a capacitor comprising a first electrode and a second electrode;
   a correction inverter of which an input portion is connected to the first electrode of the capacitor;
   an output inverter of which an input portion is connected to an output portion of the correction inverter electrically;
   a switch for setting a threshold value connected to the input portion of the correction inverter and the output portion of the correction inverter;
   a switch for receiving a clock signal connected to the second electrode of the capacitor; and
   a reference switch connected to a connection of the switch for receiving a clock signal and the second electrode of the capacitor to supply a reference voltage to the connection of the switch for receiving a clock signal and the second electrode of the capacitor,
   wherein the switch for receiving a clock signal inputs the clock signal to the second electrode of the capacitor,
   wherein the reference switch inputs a reference potential to the second electrode of the capacitor, and
   wherein the switch for setting a threshold value is controlled by a signal generated from an output pulse of the shift register.

10. An electronic apparatus according to claim 9, wherein an H-level and an L-level of the clock signal are used as the reference potential.

11. An electronic apparatus according to claim 9, further comprising a switch for fixing a potential of the input portion of the correction inverter.

12. An electronic apparatus according to claim 9, further comprising a switch for fixing a potential, wherein the input portion of the correction inverter is connected to a GND power supply through the switch for fixing a potential.

* * * * *